(12) United States Patent
Breitwisch et al.

(10) Patent No.: US 8,105,859 B2
(45) Date of Patent: Jan. 31, 2012

(54) IN VIA FORMED PHASE CHANGE MEMORY CELL WITH RECESSED PILLAR HEATER

(75) Inventors: Matthew J. Breitwisch, Yorktown Heights, NY (US); Roger W. Cheek, Sommers, NY (US); Eric A. Joseph, White Plains, NY (US); Chung H. Lam, Peekskill, NY (US); Alejandro G. Schrott, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 62 days.

(21) Appl. No.: 12/556,198

(22) Filed: Sep. 9, 2009

(65) Prior Publication Data

US 2011/0057162 A1   Mar. 10, 2011

(51) Int. Cl.
*H01L 21/00* (2006.01)
*H01L 45/00* (2006.01)

(52) U.S. Cl. .............. 438/54; 257/E45.002; 257/3

(58) Field of Classification Search ............ 438/54, 438/95; 257/E45.002
See application file for complete search history.

(56) References Cited

U.S. PATENT DOCUMENTS

| | | | |
|---|---|---|---|
| 7,671,354 B2 * | 3/2010 | Happ et al. ............... | 257/3 |
| 2006/0113520 A1 * | 6/2006 | Yamamoto et al. ......... | 257/3 |
| 2006/0266992 A1 * | 11/2006 | Matsui et al. ............. | 257/4 |
| 2008/0119007 A1 | 5/2008 | Raghuram et al. | |
| 2008/0137400 A1 | 6/2008 | Chen et al. | |
| 2008/0164452 A1 | 7/2008 | Joseph et al. | |
| 2008/0173862 A1 | 7/2008 | Song et al. | |
| 2008/0316794 A1 * | 12/2008 | Philipp et al. ............. | 365/148 |
| 2009/0014885 A1 | 1/2009 | Chen et al. | |
| 2009/0026432 A1 | 1/2009 | Liu et al. | |
| 2009/0033360 A1 | 2/2009 | Chen et al. | |

OTHER PUBLICATIONS

S.J. Ahn, et al., "Highly Reliable 50nm Contact Cell Technology for 256Mb PRAM", 2005 Symposium on VLSI Technology Digest of Technical Papers, pp. 98-99.
H. Horri, et al., "A Novel Cell Technology Using N-doped GeSbTe Films for Phase Change RAM", 2003 Symposium on VLSI Technology Digest of Technical Papers, 2 pages.

* cited by examiner

*Primary Examiner* — Jerome Jackson, Jr.
*Assistant Examiner* — Paul Budd
(74) *Attorney, Agent, or Firm* — Cantor Colburn LLP; Vazken Alexanian

(57) ABSTRACT

A method for fabricating a phase change memory device including a plurality of in via phase change memory cells includes forming pillar heaters formed of a conductive material along a contact surface of a substrate corresponding to each of an array of conductive contacts to be connected to access circuitry, forming a dielectric layer along exposed areas of the substrate surrounding the pillar heaters, forming an interlevel dielectric (ILD) layer above the dielectric layer, etching a via to the dielectric layer, each via corresponding to each of pillar heater such that an upper surface of each pillar heater is exposed within each via, recessing each pillar heater, depositing phase change material in each via on each recessed pillar heater, recessing the phase change material within each via, and forming a top electrode within the via on the phase change material.

8 Claims, 7 Drawing Sheets

IN VIA FORMED PHASE CHANGE MEMORY CELL WITH RECESSED PILLAR HEATER

BACKGROUND

The present invention relates generally to phase change memory cells, and more specifically, to an in via formed phase change memory cell having a recessed pillar heater.

Phase change material has a variety of applications in microelectronic devices such as optical storage media and solid state phase change memory devices. Phase change random access memory (PRAM) devices, for example, store data using a phase change material, such as, for example, a chalcogenide alloy, that transforms into a crystalline state or an amorphous state during cooling after a heat treatment. Each state of the phase change material has different resistance characteristics. Specifically, the phase change material in the crystalline state has low resistance and the phase change material in the amorphous state has high resistance. The crystalline state is typically referred to as a "set state" having a logic level "0", and the amorphous state is typically referred to as a "reset state" having a logic level "1". A current passed through the phase change material creates ohmic heating and causes the phase change material to melt. Melting and gradually cooling down the phase change material allows time for the phase change material to form the crystalline state. Melting and abruptly cooling the phase change material quenches the phase change material into the amorphous state.

Over recent years, progress in lithographic and deposition techniques have provided new momentum towards the realization of practical phase change memory devices. However, for switching the device, a large current density across the phase change element is still needed, and effecting the switching of the memory cell utilizing currents and voltages compatible for integration into a feasible device remains a challenge as the device is scaled down. Thus, the cell switching dynamics would be greatly improved by decreasing the size of the switching volume. Current methods for fabricating a typical mushroom-type phase change memory cell include a reactive ion etching (RIE) process on the stack containing the phase change material to form the active part of the memory cell. Potential problems may arise such as diffusion of unwanted species or voids into the phase change material and/or internal or external interfaces during the RIE process or during subsequent deposition of dielectric layers.

SUMMARY

The present invention provides a method of fabricating a phase change memory device which includes a reduced physical volume of that part of the memory cell that contains the active switching volume and effects the latter while maintaining the desired properties of the phase change material and conductive contacts. It is provides a phase change memory device that may be easily and inexpensively integrated into an existing complementary metal oxide semiconductor (CMOS) logic manufacturing flow.

According to an embodiment of the present invention, a method for fabricating a phase change memory device including a plurality of in via phase change memory cells is provided. The method includes forming pillar heaters formed of a conductive material along a contact surface of a substrate corresponding to each of an array of conductive contacts to be connected to access circuitry, forming a dielectric layer along exposed areas of the substrate surrounding the pillar heaters, forming an interlevel dielectric (ILD) layer above the dielectric layer, etching a via to the dielectric layer, each via corresponding to each of pillar heater such that an upper surface of each pillar heater is exposed within each via, recessing each pillar heater, depositing phase change material in each via on each recessed pillar heater, recessing the phase change material within each via, and forming a top electrode within the via on the phase change material.

According to another embodiment of the present invention, a method for fabricating a phase change memory device including a plurality of in via phase change memory cells is provided. The method includes depositing a conductive layer on an upper surface and a contact surface of a substrate corresponding to each of an array of conductive contacts to be connected to access circuitry, etching, using a photo resist layer, the conductive layer to form pillar heaters along the contact surface corresponding to each of the array of conductive contacts, and forming a dielectric layer along exposed areas of the substrate surrounding the pillar heaters. The method further includes forming a first cap layer on the dielectric layer, forming an ILD layer on the first cap layer, etching a via to the dielectric layer, each via corresponding to each of pillar heater such that an upper surface of each pillar heater is exposed within each via, and recessing each pillar heater. The method further includes depositing phase change material in each via on each recessed pillar heater, recessing the phase change material within each via; and forming a top electrode within the via on the phase change material.

According to yet another embodiment of the present invention, a phase change memory device including a plurality of in via phase change memory cells is provided. The phase change memory device includes a substrate having a contact surface corresponding to an array of conductive contacts to be connected to access circuitry, a plurality of recessed pillar heaters formed within a dielectric layer formed on the substrate and corresponding to each of the array of conductive contacts, a plurality of vias formed in the dielectric layer, each corresponding to a recessed pillar heater and filled with recessed phase change material, a top electrode formed within each via and contacting the recessed phase change material, and a top electrode connection layer formed on an upper surface of the top electrode.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 1:
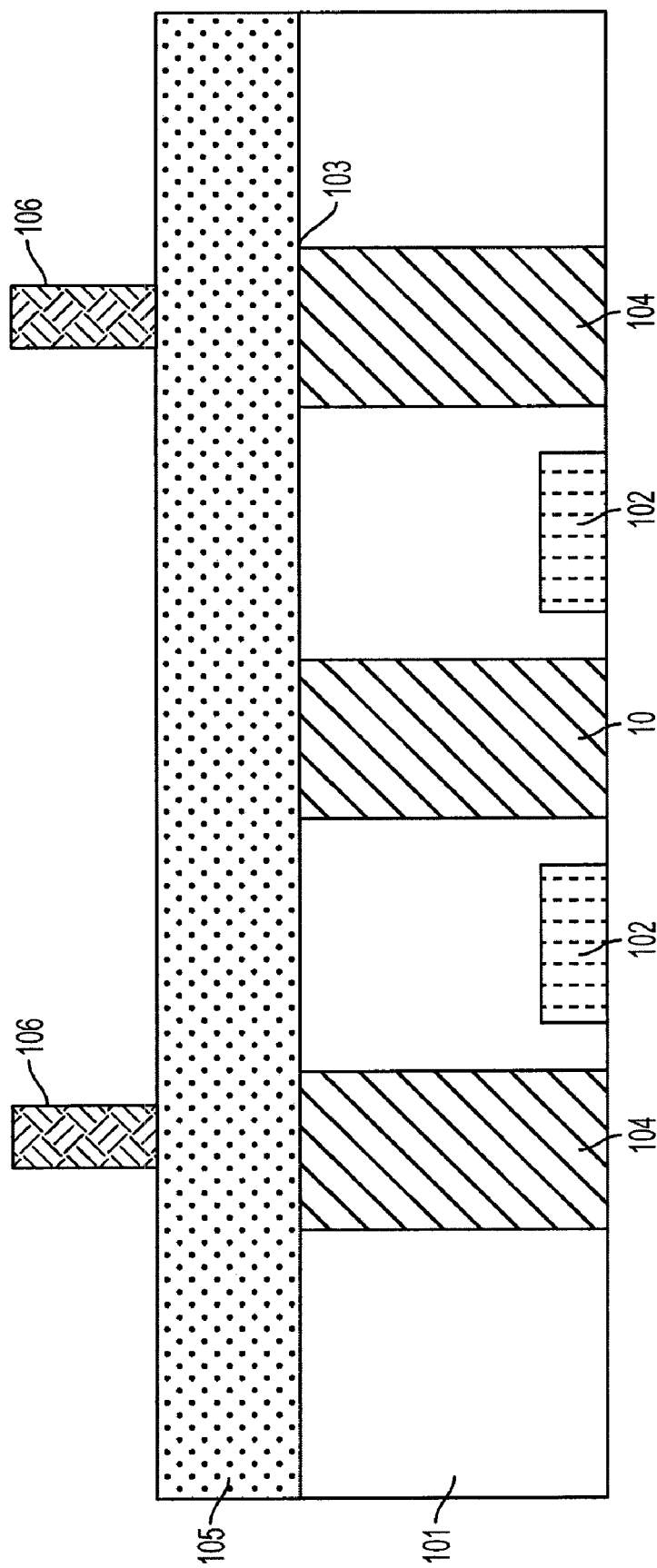
FIG. 1 is a diagram illustrating fabrication operation of a phase change memory device having in via phase change memory cells that can be implemented within embodiments of the present invention.
Figure 2:
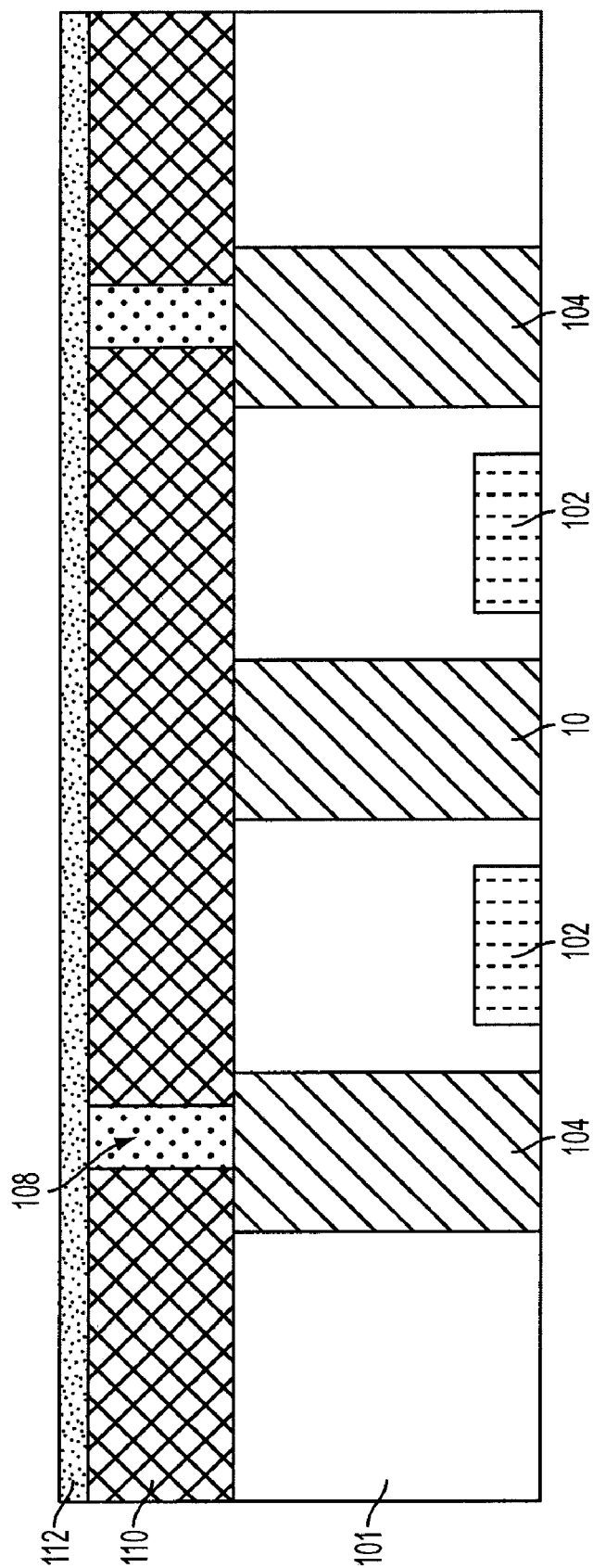
FIG. 2 is a diagram illustrating the formation of pillar heaters in the in via phase change memory cells that can be implemented within embodiments of the present invention.

FIGS. 1 through 7B illustrate a fabrication method for fabricating a phase change memory device having in via phase change memory cells according to an embodiment of the present invention. With reference now to FIG. 1, a substrate 101 is provided and includes access circuitry (e.g., access transistors) (not shown) for the plurality of phase change memory cells. Word lines 102 are connected with gates of the access transistors and a common source line 10 contacts a source region of the access transistors. The substrate 101 further includes a contact surface 103 having an array of conductive contacts 104 to be connected with the access circuitry. According to an embodiment of the present invention, the substrate 101 includes an oxide layer which may be silicon oxide, for example. Alternatively, the substrate 101 may include bulk semiconductor, strained semiconductor, silicon on insulator (SOI) and other commonly used semiconductor substrates. The access circuitry may include transistors such as complementary metal oxide semiconductor (CMOS) or bipolar junction transistors (BJTs) or diodes. A conductive layer 105 is deposited on substrate 101 and the contact surface 103. The conductive layer 105 may be made of titanium nitride (TiN), tantalum nitride (TaN), tantalum-silicon nitride (TaSiN), tungsten (W), carbon, or any suitable conductive material. A patterned photo resist layer 106 formed on the conductive layer 105 is used as a mask to etch the conductive layer 105 to form bottom electrode pillar heaters 108 (as depicted in FIG. 2).

FIG. 2 is a diagram illustrating a pillar heater of each phase change memory cell that can be implemented within embodiments of the present invention. As shown in FIG. 2, pillar heaters 108 are formed along the contact surface 103 corresponding to each conductive contact 104. The pillar heaters 108 are formed of a predetermined thickness of approximately 40 nanometers (nm) to 200 nanometers (nm). A dielectric layer 110 is formed to fill in exposed areas of the substrate 101 surrounding the pillar heaters 108 and polished via a chemical mechanical polishing (CMP) process. According to one embodiment of the present invention, the dielectric layer 110 may be formed of, for example, high density plasma (HDP) oxide. However, the present invention is not limited hereto. A first cap layer 112 is then formed over the dielectric layer 110 and the pillar heaters 108 to protect the pillar heaters 108. The first cap layer 112 is formed of silicon nitride (SiN), for example.

Figure 3:
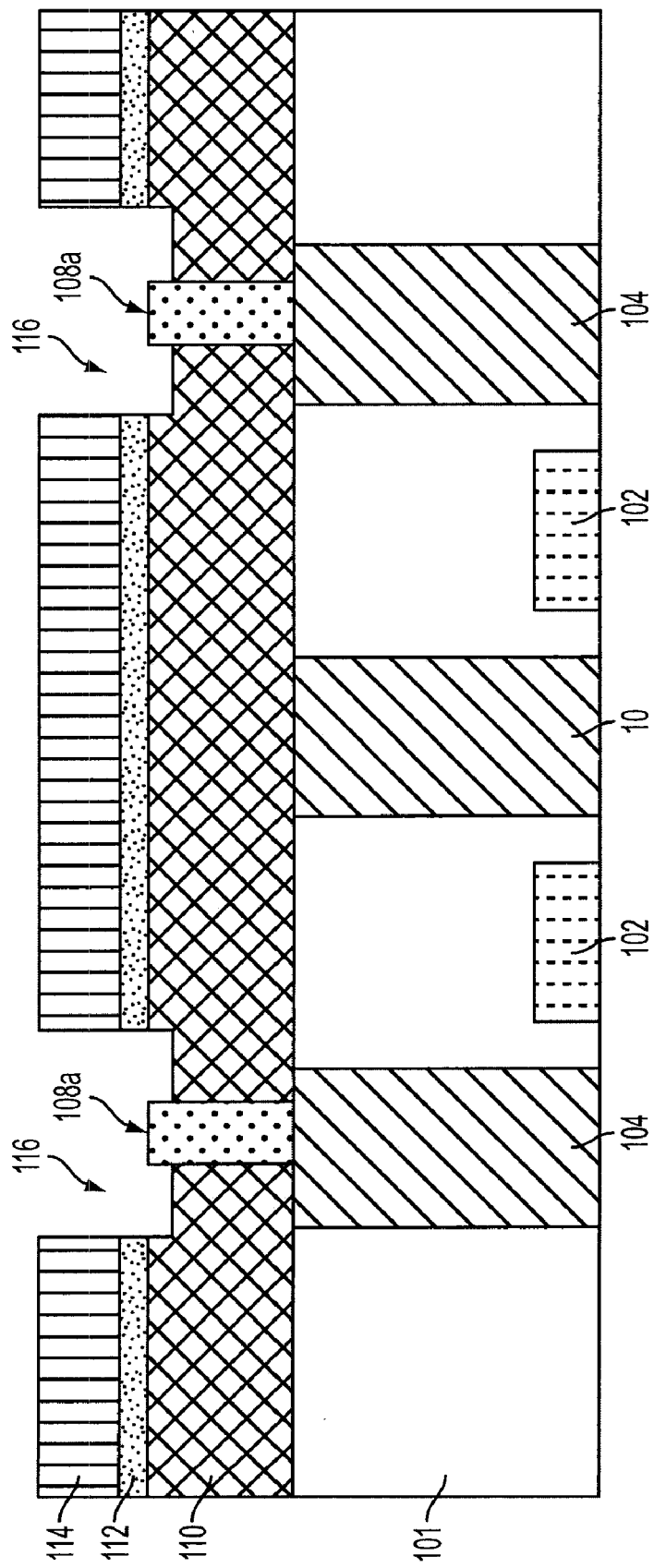
FIG. 3 is a diagram illustrating an etching operation for forming via openings of the in via phase change memory cells that can be implemented within embodiments of the present invention.

FIG. 3 is a diagram illustrating the formation of a via opening in the phase change memory cells that can be implemented within embodiments of the present invention. As shown in FIG. 3, an interlevel dielectric (ILD) layer 114 is formed on the cap layer 112. The ILD layer 114 may be formed of, for example, silane oxide. However, the present invention is not limited hereto and may vary as necessary. A via 116 is formed in the ILD layer 114 using a lithographic process. The via 116 extends through the first cap layer 112 and may slightly extend into a portion of the dielectric layer 110, depending on the selectivity of the etch process, to expose an upper surface 108a of the pillar heaters 108. The first cap layer 112 allows the use of selective etching to form the via 116. Typically, the height of the via 116 is mainly determined by determined by the combined thickness of the first cap layer 112 and the ILD layer 114, and ranges from approximately 100 nanometers (nm) to 600 approximately nanometers (nm). The diameter of the via 116 typically ranges from approximately 30 nanometers (nm) to approximately 200 nanometers (nm).

Figure 4:
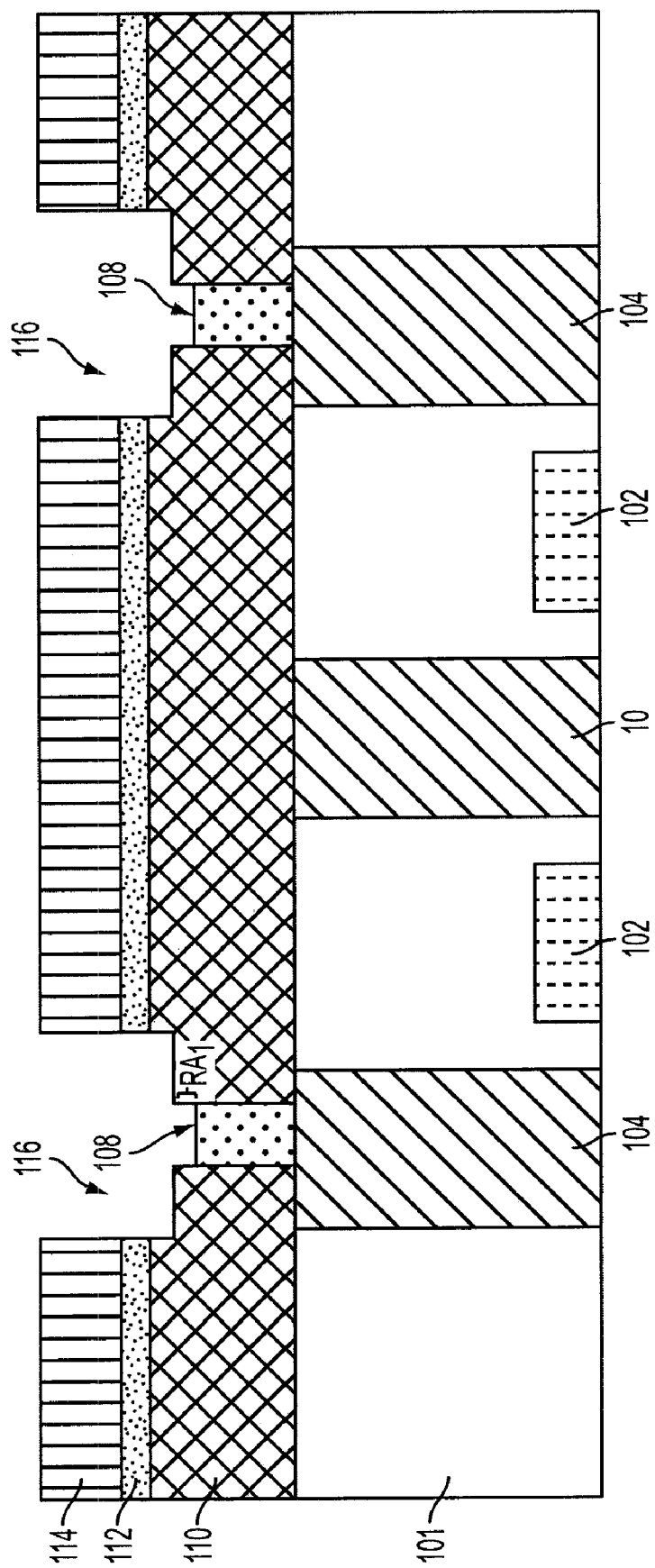
FIG. 4 is a diagram illustrating a recess operation of the pillar heaters shown in FIG. 2 that can be implemented within embodiments of the present invention.

FIG. 4 is a diagram illustrating a recess operation of the pillar heaters that can be implemented within embodiments of the present invention. As shown in FIG. 4, the pillar heaters 108 are recessed via a selective reactive ion etching (RIE) process. The recessed amount ($RA_1$) ranges from approximately 20 nanometers (nm) to 100 nanometers (nm), so that no more than half of the total length of the pillar heater 108 is recessed.

Figure 5:
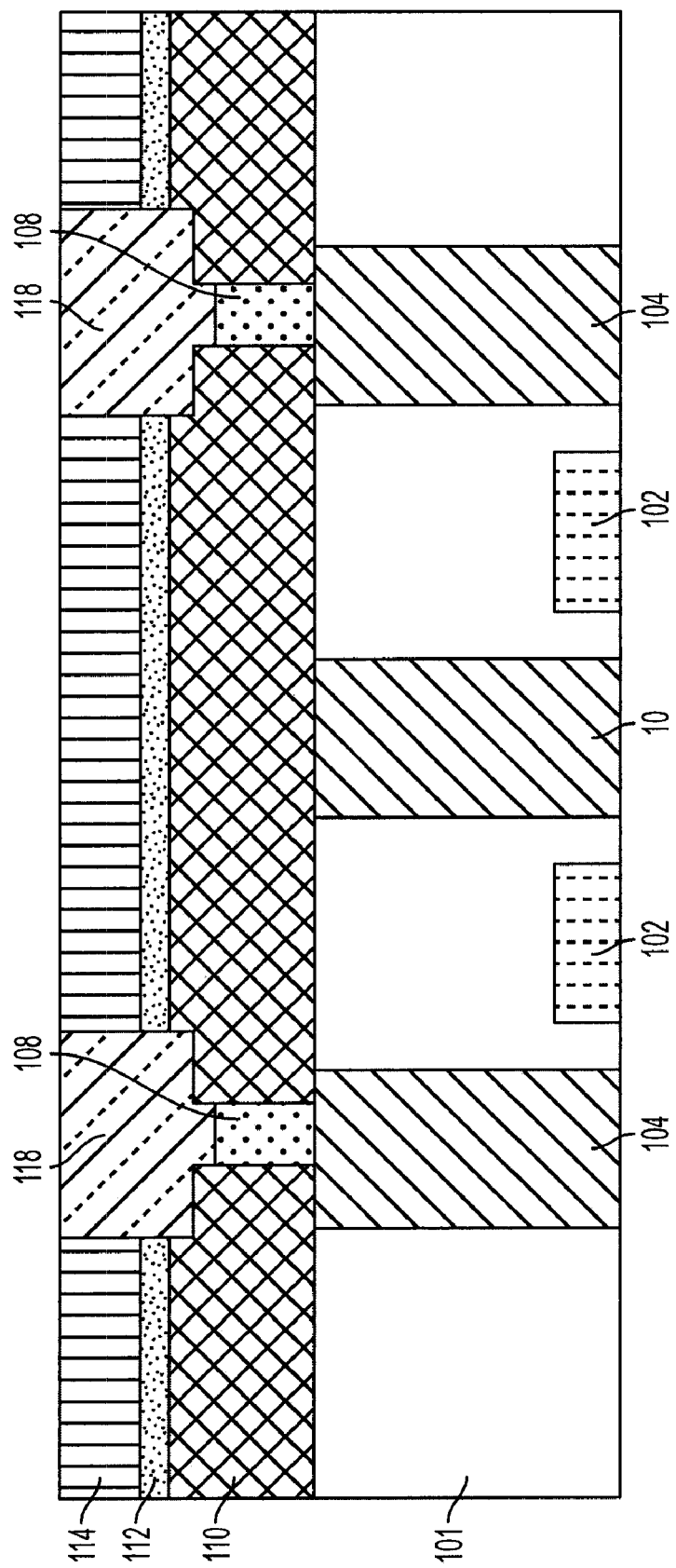
FIG. 5 is a diagram illustrating a deposition operation of phase change material within the in via phase change memory cells that can be implemented within embodiments of the present invention.
Figure 7B:
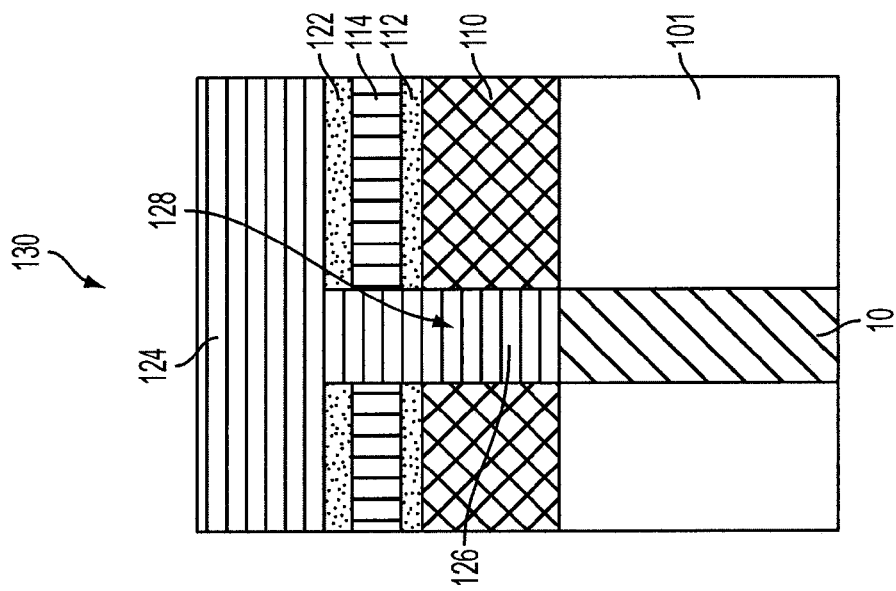
FIGS. 7A and 7B are diagrams respectively illustrating the formation of a top electrode connection layer and a contact within a periphery that can be implemented within embodiments of the present invention.
Figure 7A:
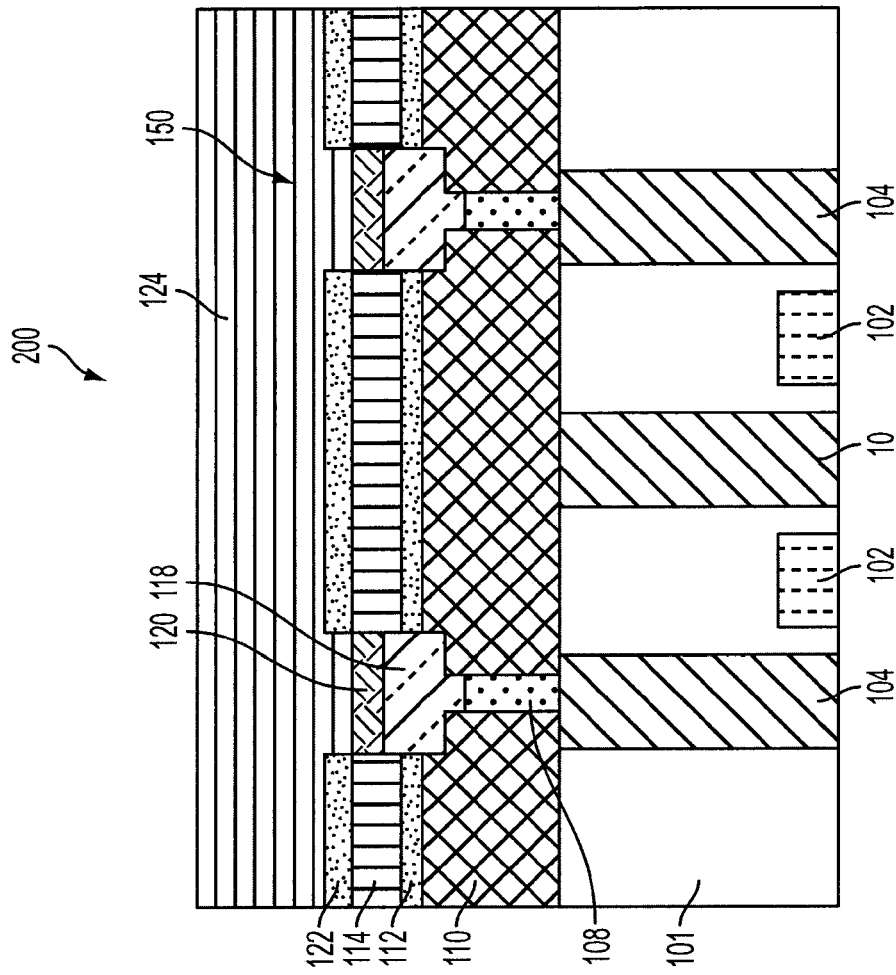

FIG. 5 is a diagram illustrating a deposition operation of phase change material within the phase change memory device that can be implemented within embodiments of the present invention. As shown in FIG. 5, phase change material 118 is deposited into the via 116 either by a chemical vapor deposition (CVD), atomic layer deposition (ALD), or physical vapor deposition (PVD) process or a combination of the three, and contacts each recessed pillar heater 108. The phase change material 118 defines the active region of the memory cell 150 (as depicted in FIG. 7A). The phase change material 118 is then polished via a CMP process, for example. According to an embodiment of the present invention, the phase change material 118 may include alloys of gallium (Ga)/Sb, indium (In)/Sb, In/selenium (Se), antimony (Sb)/tellurium (Te), germanium (Ge)/Te, Ge/Sb/Te, In/Sb/Te, Ga/Se/Te, Sn/Sb/Te, In/Sb/Ge, silver (Ag)/In/Sb/Te, Ge/Sb/Se/Te, Te/Ge/Sb/sulfur (S). A wide range of alloy compositions may be used.

Figure 6:
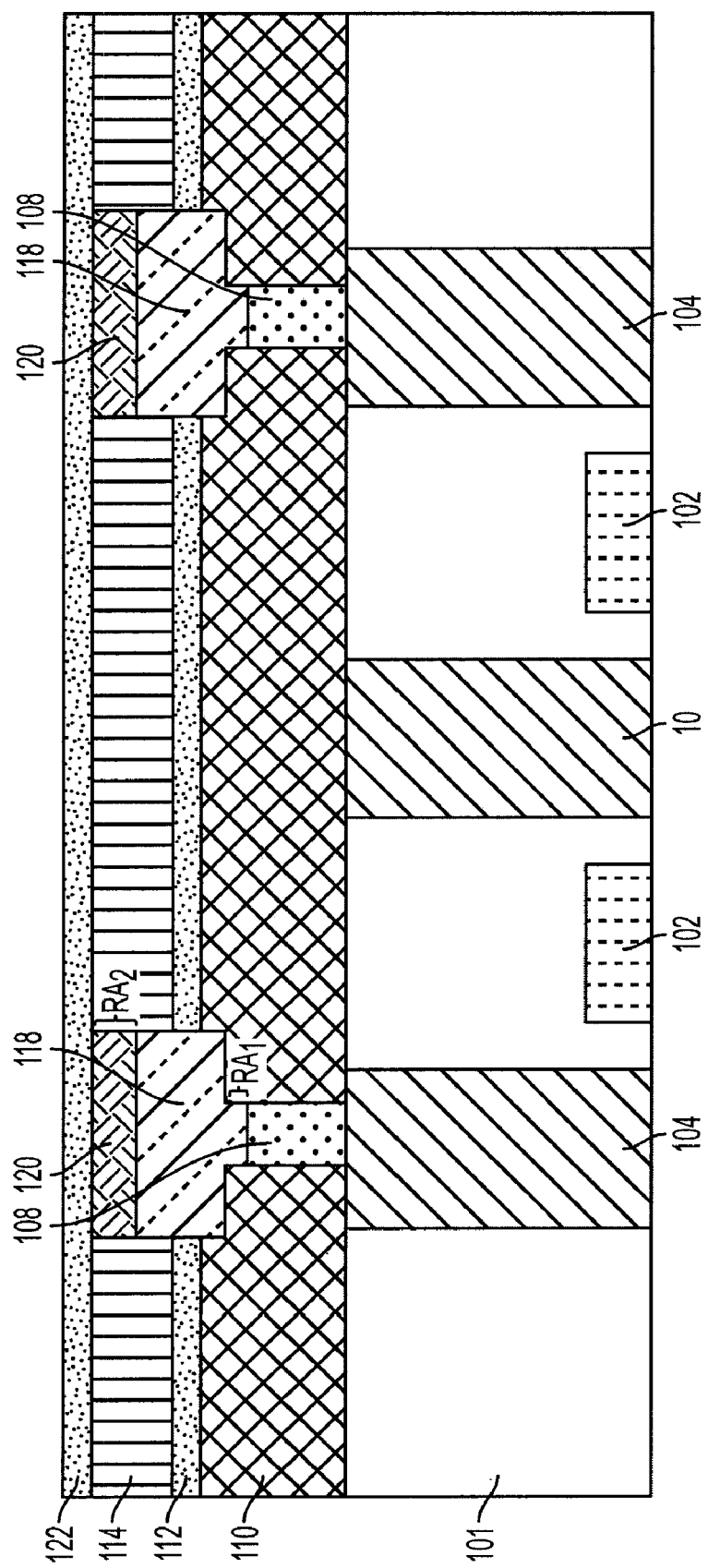
FIG. 6 is a diagram illustrating a recess operation of the phase change material and a formation operation of a top electrode that can be implemented within embodiments of the present invention.

FIG. 6 is a diagram illustrating the formation of a top electrode of each phase change memory cell that can be implemented within embodiments of the present invention. As shown in FIG. 6, the phase change material 118 within the via 116 is recessed by an ion etching operation, for example. The recessed amount ($RA_2$) ranges from approximately 20 nanometers (nm) to approximately 200 nanometers (nm). As a result, the recessed phase change material 118 is of a predetermined thickness of ranging from approximately 80 nanometers (nm) to approximately 400 nanometers (nm). According to an embodiment of the present invention, the recessed amounts $RA_1$ and $RA_2$ are parameters that may be varied to improve cell function. For example, $RA_1$ may be approximately 60 nanometers (nm), while $RA_2$ may be approximately 20 nanometers (nm). The latter is done to remove oxidized or contaminated material after CMP. These parameters work well for a memory cell with a pillar electrode approximately 140 nanometers (nm) initial height, and a diameter of approximately 40 nanometers (nm). With a via 116 having a height of approximately 120 nanometers (nm), and a diameter of approximately 100 nanometers (nm).

Further in FIG. 6, electrode material such as titanium nitride (TiN) or other conductive material is deposited on the recessed phase change material 118 within the via 116, to form a top electrode 120. The electrode material is then polished via a CMP process, for example. A second cap layer 122 is then formed on the top electrode 120 to protect the top electrode 120.

FIG. 7A is a diagram illustrating a phase change memory device that can be implemented within embodiments of the present invention. As shown in FIG. 7A, the second cap layer 122 is etched to expose an upper surface of the top electrode 120 and a top electrode connection layer 124 is formed over the exposed upper surface of each top electrode 120, over the second cap layer 122 and on a periphery 130. The top electrode connection layer 124 is perpendicular to the conductive contacts 104 formed within the substrate 100. The top electrode 120 receives bit signals via the top electrode connection layer 124, and a current path is formed by a bit line, the top electrode 120, the phase change material 118, the pillar heater 108 and the conductive contact 104 to an access transistor (not shown). In FIG. 7B, a contact 126 of the periphery 130 is formed in a via 128 and connects to the source line 10 which connects with a second contact of the access transistor. As a result of the fabrication method shown in FIGS. 1 through 6, a phase change memory device 150 including a plurality of memory cells 150 is formed. According to an embodiment of the present invention, the preferred measurements of each memory cell 150 are approximately 260 nanometers (nm) in length and approximately 100 nanometers (nm) in width.

Embodiments of the present invention provide a method for fabricating a memory cell by forming a recessed pillar heater and then depositing the phase change material in a via formed in the dielectric layer, on top of the recessed pillar heater, thus avoiding the performance of a RIE process on the phase change material. The present invention provides the advantage of enabling the volume of phase change material to be accurately located on the pillar heater, thereby providing localized heating and thermally separating the phase change material from the conducting via. The via is filled with the phase change material to define the active region of the memory cell, therefore providing a phase change memory device with improved and simplified manufacturability.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one ore more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method for fabricating a phase change memory device including a plurality of in via phase change memory cells, the method comprising:
    depositing a conductive layer on an upper surface and a contact surface of a substrate corresponding to each of an array of conductive contacts to be connected to access circuitry;
    etching, using a photo resist layer, the conductive layer to form pillar heaters along the contact surface corresponding to each of the array of conductive contacts;
    forming a dielectric layer along exposed areas of the substrate surrounding the pillar heaters;
    forming a first cap layer on the dielectric layer;
    forming an interlevel dielectric (ILD) layer on the first cap layer;
    etching a via into the dielectric layer, each via corresponding to each of pillar heater such that an upper surface of each pillar heater is exposed within each via;
    recessing each pillar heater;
    depositing phase change material in each via on each recessed pillar heater;
    recessing the phase change material within each via;
    forming a top electrode within the via on the phase change material;
    forming a second cap layer on the top electrode; and
    etching the second cap layer to expose an upper surface of each top electrode and forming a top electrode connection layer over the exposed upper surface of each top electrode and the second cap layer.

2. The method of claim 1, wherein the conductive layer comprises at least one of titanium nitride (TiN), tantalum nitride (TaN), tantalum-silicon nitride (TaSiN), tungsten (W) or carbon (C).

3. The method of claim 1, wherein the dielectric layer comprises high density plasma (HDP) oxide.

4. The method of claim 1, wherein the ILD layer is formed of silane oxide.

5. The method of claim 1, wherein each pillar heater is recessed via a selective reactive ion etching operation.

6. The method of claim 5, wherein a recessed amount of each pillar heater ranges from approximately 20 nanometers (nm) to approximately 100 nanometers (nm).

7. The method of claim 1, wherein a recessed amount of the phase change material ranges from approximately 20 nanometers (nm) to approximately 200 nanometers (nm).

8. The method of claim 7, wherein the recessed phase change material is of a predetermined thickness of ranging from approximately 80 nanometers (nm) to approximately 400 nanometers (nm).

* * * * *